United States Patent
Wu et al.

(10) Patent No.: US 7,923,385 B2
(45) Date of Patent: *Apr. 12, 2011

(54) METHODS FOR PRODUCING LOW STRESS POROUS AND CDO LOW-K DIELECTRIC MATERIALS USING PRECURSORS WITH ORGANIC FUNCTIONAL GROUPS

(75) Inventors: Qingguo Wu, Vancouver, WA (US); Haiying Fu, Camas, WA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/479,114

(22) Filed: Jun. 5, 2009

(65) Prior Publication Data

US 2009/0239390 A1    Sep. 24, 2009

Related U.S. Application Data

(60) Continuation of application No. 12/348,791, filed on Jan. 5, 2009, which is a continuation of application No. 11/764,750, filed on Jun. 18, 2007, now Pat. No. 7,473,653, which is a division of application No. 10/927,777, filed on Aug. 27, 2004, now Pat. No. 7,241,704, which is a continuation-in-part of application No. 10/672,311, filed on Sep. 26, 2003, now Pat. No. 7,208,389, and a continuation-in-part of application No. 10/404,693, filed on Mar. 31, 2003, now abandoned.

(60) Provisional application No. 60/469,433, filed on May 9, 2003.

(51) Int. Cl.
*H01L 21/31* (2006.01)
*H01L 21/3105* (2006.01)
*H01L 21/316* (2006.01)
*C23C 16/40* (2006.01)

(52) U.S. Cl. ........ 438/789; 438/790; 438/783; 438/784; 427/255.37

(58) Field of Classification Search ............ 427/255.28, 427/255.18, 255.27, 255.37, 255.393, 387, 427/551, 553, 557; 438/507, 509, 780–782, 438/787, 788, 789, 790, 783, 784

See application file for complete search history.

(56) References Cited

U.S. PATENT DOCUMENTS 4,357,451 A    11/1982    McDaniel
(Continued)

FOREIGN PATENT DOCUMENTS

WO    WO 03/005429    1/2003
(Continued)

OTHER PUBLICATIONS

U.S. Appl. No. 10/820,525, Office Action mailed Mar. 31, 2008.
(Continued)

*Primary Examiner* — Mary Wilczewski
(74) *Attorney, Agent, or Firm* — Weaver Austin Villeneuve & Sampson LLP

(57) ABSTRACT

Methods of preparing a carbon doped oxide (CDO) layers having a low dielectric constant are provided. The methods involve, for instance, providing a substrate to a deposition chamber and exposing it to one or multiple carbon-doped oxide precursors having molecules with at least one carbon-carbon triple bond, or carbon-carbon double bond, or a combination of these groups and depositing the carbon doped oxide dielectric layer under conditions in which the resulting dielectric layer has a dielectric constant of not greater than about 2.7. Methods of preparing a low stress porous low-k dielectric material on a substrate are provided. The methods involve the use of a structure former precursor and/or porogen precursor with one or more organic functional groups. In some cases, the structure former precursor has carbon-carbon double or triple bonds. In other cases, one or both of the structure former precursor and porogen precursor has one or more bulky organic groups. In other cases, the structure former precursor has carbon-carbon double or triple bonds and one or both of the structure former precursor and porogen precursor has one or more bulky organic groups. Once the precursor film is formed, the porogen is removed, leaving a porous low-k dielectric matrix with high mechanical strength. Different types of structure former precursors and porogen precursors are described. The resulting low stress low-k porous film may be used as a low-k dielectric film in integrated circuit manufacturing applications.

24 Claims, 7 Drawing Sheets

U.S. PATENT DOCUMENTS

| | | | |
|---|---|---|---|
| 4,837,185 A | 6/1989 | Yau et al. | |
| 4,885,262 A | 12/1989 | Ting et al. | |
| 5,088,003 A | 2/1992 | Sakai et al. | |
| 5,364,665 A * | 11/1994 | Felts et al. | 427/571 |
| 5,504,042 A | 4/1996 | Cho et al. | |
| 5,686,054 A | 11/1997 | Barthel et al. | |
| 5,851,715 A | 12/1998 | Barthel et al. | |
| 5,858,457 A | 1/1999 | Brinker et al. | |
| 6,020,035 A | 2/2000 | Gupta et al. | |
| 6,045,877 A * | 4/2000 | Gleason et al. | 427/522 |
| 6,072,227 A | 6/2000 | Yau et al. | |
| 6,140,252 A | 10/2000 | Cho et al. | |
| 6,159,871 A * | 12/2000 | Loboda et al. | 438/786 |
| 6,232,658 B1 | 5/2001 | Catabay et al. | |
| 6,258,735 B1 | 7/2001 | Xia et al. | |
| 6,268,288 B1 | 7/2001 | Hautala et al. | |
| 6,270,846 B1 | 8/2001 | Brinker et al. | |
| 6,271,273 B1 | 8/2001 | You et al. | |
| 6,329,017 B1 | 12/2001 | Liu et al. | |
| 6,340,628 B1 | 1/2002 | Van Cleemput et al. | |
| 6,348,725 B2 | 2/2002 | Cheung et al. | |
| 6,365,266 B1 | 4/2002 | MacDougall et al. | |
| 6,365,528 B1 | 4/2002 | Sukharev et al. | |
| 6,372,304 B1 | 4/2002 | Sano et al. | |
| 6,383,466 B1 | 5/2002 | Domansky et al. | |
| 6,383,955 B1 | 5/2002 | Matsuki et al. | |
| 6,386,466 B1 | 5/2002 | Ozawa et al. | |
| 6,387,453 B1 | 5/2002 | Brinker et al. | |
| 6,392,017 B1 | 5/2002 | Chandrashekar | |
| 6,395,649 B1 | 5/2002 | Wu | |
| 6,407,013 B1 | 6/2002 | Li et al. | |
| 6,410,462 B1 | 6/2002 | Yang et al. | |
| 6,413,583 B1 | 7/2002 | Moghadam et al. | |
| 6,420,441 B1 | 7/2002 | Allen et al. | |
| 6,436,824 B1 | 8/2002 | Chooi et al. | |
| 6,444,715 B1 | 9/2002 | Mukherjee et al. | |
| 6,448,654 B1 | 9/2002 | Gabriel et al. | |
| 6,465,366 B1 | 10/2002 | Nemani et al. | |
| 6,465,372 B1 * | 10/2002 | Xia et al. | 438/787 |
| 6,472,306 B1 | 10/2002 | Lee et al. | |
| 6,479,374 B1 | 11/2002 | Ioka et al. | |
| 6,479,409 B2 | 11/2002 | Shioya et al. | |
| 6,486,061 B1 * | 11/2002 | Xia et al. | 438/680 |
| 6,548,113 B1 | 4/2003 | Birnbaum et al. | |
| 6,558,755 B2 | 5/2003 | Berry et al. | |
| 6,566,278 B1 | 5/2003 | Harvey et al. | |
| 6,572,925 B2 | 6/2003 | Zubkov et al. | |
| 6,576,300 B1 | 6/2003 | Berry et al. | |
| 6,596,654 B1 | 7/2003 | Bayman et al. | |
| 6,602,806 B1 * | 8/2003 | Xia et al. | 438/786 |
| 6,610,362 B1 | 8/2003 | Towle | |
| 6,632,478 B2 | 10/2003 | Gaillard et al. | |
| 6,635,583 B2 | 10/2003 | Bencher et al. | |
| 6,662,631 B2 | 12/2003 | Baklanov et al. | |
| 6,677,251 B1 | 1/2004 | Lu et al. | |
| 6,713,407 B1 | 3/2004 | Cheng et al. | |
| 6,740,602 B1 | 5/2004 | Hendriks et al. | |
| 6,756,085 B2 | 6/2004 | Waldfried et al. | |
| 6,759,098 B2 | 7/2004 | Han et al. | |
| 6,797,643 B2 | 9/2004 | Rocha-Alvarez et al. | |
| 6,812,043 B2 | 11/2004 | Bao et al. | |
| 6,815,373 B2 | 11/2004 | Singh et al. | |
| 6,831,284 B2 | 12/2004 | Demos et al. | |
| 6,855,645 B2 * | 2/2005 | Tang et al. | 438/778 |
| 6,867,086 B1 | 3/2005 | Chen et al. | |
| 6,890,850 B2 | 5/2005 | Lee et al. | |
| 6,903,004 B1 | 6/2005 | Spencer et al. | |
| 6,914,014 B2 | 7/2005 | Li et al. | |
| 6,921,727 B2 | 7/2005 | Chiang et al. | |
| 7,064,088 B2 | 6/2006 | Hyodo et al. | |
| 7,087,271 B2 * | 8/2006 | Rhee et al. | 427/577 |
| 7,094,713 B1 | 8/2006 | Niu et al. | |
| 7,098,149 B2 | 8/2006 | Lukas et al. | |
| 7,166,531 B1 | 1/2007 | van den Hoek et al. | |
| 7,176,144 B1 | 2/2007 | Wang et al. | |
| 7,208,389 B1 | 4/2007 | Tipton et al. | |
| 7,241,704 B1 | 7/2007 | Wu et al. | |
| 7,253,125 B1 * | 8/2007 | Bandyopadhyay et al. | 438/795 |
| 7,288,292 B2 | 10/2007 | Gates et al. | |
| 7,326,444 B1 | 2/2008 | Wu et al. | |
| 7,341,761 B1 | 3/2008 | Wu et al. | |
| 7,381,659 B2 | 6/2008 | Nguyen et al. | |
| 7,381,662 B1 | 6/2008 | Niu et al. | |
| 7,390,537 B1 | 6/2008 | Wu et al. | |
| 7,473,653 B1 | 1/2009 | Wu et al. | |
| 7,611,757 B1 * | 11/2009 | Bandyopadhyay et al. | 427/558 |
| 7,629,224 B1 | 12/2009 | van den Hoek et al. | |
| 7,695,765 B1 | 4/2010 | Fox et al. | |
| 7,737,525 B1 | 6/2010 | Wu et al. | |
| 7,799,705 B1 | 9/2010 | Wu et al. | |
| 2002/0001973 A1 | 1/2002 | Wu et al. | |
| 2002/0034626 A1 | 3/2002 | Liu et al. | |
| 2002/0106500 A1 | 8/2002 | Albano et al. | |
| 2002/0132496 A1 | 9/2002 | Ball et al. | |
| 2002/0172766 A1 | 11/2002 | Laxman et al. | |
| 2003/0064154 A1 | 4/2003 | Laxman et al. | |
| 2003/0064607 A1 | 4/2003 | Leu et al. | |
| 2003/0077896 A1 | 4/2003 | Saito et al. | |
| 2003/0111263 A1 | 6/2003 | Fornof et al. | |
| 2003/0176080 A1 | 9/2003 | Fu et al. | |
| 2003/0203652 A1 | 10/2003 | Bao et al. | |
| 2003/0224156 A1 | 12/2003 | Kirner et al. | |
| 2004/0018717 A1 | 1/2004 | Fornof et al. | |
| 2004/0069410 A1 | 4/2004 | Moghadam et al. | |
| 2004/0096593 A1 | 5/2004 | Lukas et al. | |
| 2004/0096672 A1 | 5/2004 | Lukas et al. | |
| 2004/0099952 A1 | 5/2004 | Goodner et al. | |
| 2004/0101633 A1 | 5/2004 | Zheng et al. | |
| 2004/0126929 A1 * | 7/2004 | Tang et al. | 438/118 |
| 2004/0161532 A1 | 8/2004 | Kloster et al. | |
| 2004/0166240 A1 * | 8/2004 | Rhee et al. | 427/255.28 |
| 2004/0170760 A1 | 9/2004 | Meagley et al. | |
| 2004/0185679 A1 | 9/2004 | Ott et al. | |
| 2004/0213911 A1 | 10/2004 | Misawa et al. | |
| 2004/0249006 A1 | 12/2004 | Gleason et al. | |
| 2005/0025892 A1 | 2/2005 | Satoh et al. | |
| 2005/0064698 A1 | 3/2005 | Chang et al. | |
| 2005/0095840 A1 | 5/2005 | Bhanap et al. | |
| 2005/0156285 A1 | 7/2005 | Gates et al. | |
| 2005/0230834 A1 | 10/2005 | Schmitt et al. | |
| 2005/0260420 A1 | 11/2005 | Collins et al. | |
| 2006/0024976 A1 | 2/2006 | Waldfried et al. | |
| 2006/0027929 A1 | 2/2006 | Cooney et al. | |
| 2006/0040507 A1 | 2/2006 | Mak et al. | |
| 2006/0105566 A1 | 5/2006 | Waldfried et al. | |
| 2006/0110931 A1 | 5/2006 | Fukazawa et al. | |
| 2006/0145304 A1 | 7/2006 | Boyanov et al. | |
| 2006/0145305 A1 | 7/2006 | Boyanov et al. | |
| 2006/0178006 A1 | 8/2006 | Xu et al. | |
| 2008/0009141 A1 | 1/2008 | Dubois et al. | |
| 2008/0132055 A1 | 6/2008 | Nguyen et al. | |
| 2009/0239390 A1 * | 9/2009 | Wu et al. | 438/780 |

FOREIGN PATENT DOCUMENTS

| | | |
|---|---|---|
| WO | WO 03/052794 | 6/2003 |

OTHER PUBLICATIONS

U.S. Appl. No. 10/807,680, Office Action mailed Jul. 10, 2008.
U.S. Appl. No. 10/987,208, Office Action mailed Aug. 5, 2008.
Cho et al., "Plasma Treatments of Molecularly Templated Nanoporous Silica Films," Electrochemical and Solid-State Letters, 4 (4) G35-G38 (2001).
Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.
Schulberg et al., "System for Deposition of Mesoporous Materials," U.S. Appl. No. 10/295,965, filed Nov. 15, 2002, 64 Pages.
Watkins et al., "Mesoporous Materials and Methods," U.S. Appl. No. 10/301,013, filed Nov. 21, 2002, 34 Pages.
Jan, C.H., et al, *90NM Generation, 300mm Wafer Low k ILD/Cu Interconnect Technology*, 2003 IEEE Interconnect Technology Conference.
Wu et al., U.S. Appl. No. 10/820,525, entitled: Methods for Producing Low-K CDO Films With Low Residual Stress;filed Apr. 7, 2004.
Gangpadhyay et al., "The First International Surface Cleaning Workshop," Northeastern University, Nov. 11-14, 2002.

Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.

Fox et al., "Methods for Producing Low-Stress Carbon-Doped Oxide Films With Improved Integration Properties", U.S. Appl. No. 10/987,208, filed Nov. 12, 2004.

U.S. Office Action mailed Sep. 7, 2006, from U.S. Appl. No. 10/820,525.

U.S. Office Action mailed Mar. 28, 2007, from U.S. Appl. No. 10/820,525.

Niu et al., "Methods for Improving the Cracking Resistance of Low-K Dielectric Materials," Novellus Systems, Inc., U.S. Appl. No. 11/376,510, filed Mar. 14, 2006, pp. 1-28.

U.S. Office Action dated May 22, 2007, from U.S. Appl. No. 11/376,510.

Wu et al., "PECVD Methods for Producing Ultra Low-K Dielectric Films Using UV Treatment," Novellus Systems, Inc., U.S. Appl. No. 11/608,056, filed Dec. 7, 2006, pp. 1-34.

Wu et al., "Methods for Improving Performance of ODC Films with Dielectric Constant < 4.0," Novellus Systems, Inc., U.S. Appl. No. 11/693,661, filed Mar. 29, 2007, pp. 1-46.

U.S. Office Action dated Nov. 28, 2007, from U.S. Appl. No. 10/807,680.

R.J. Lewis, Sr., Hawley's Condensed Chemical Dictionary, $12^{th}$ Edition, Van Nostrand Reinhold Co., New York, 1993 (no month), excerpts pp. 916-918 & 1123-1124.

U.S. Office Action mailed Oct. 4, 2007, from U.S Appl. No. 10/820,525.

Wu et al., Methods for Producing Low-K CDO Films, U.S. Appl. No. 11/936,754, filed Nov. 7, 2007.

Wu et al., "Methods for Improving Integration Performance of Low Stress CDO Films", U.S. Appl. No. 11/936,752, filed Nov. 7, 2007.

Solomons and Fryhle, Organic Chemistry, $9^{th}$ Edition, John Wiley & Sons, Inc., 2008, pp. 602-603.

U.S. Appl. No. 11/369,658, "Methods for fabricating high hardness/modulus low dielectric constant materials", Wu et al., filed Mar. 6, 2006.

U.S. Appl. No. 11/369,658, Office Action mailed Dec. 12, 2008.

U.S. Appl. No. 10/987,208, Office Action mailed Feb. 4, 2009.

U.S. Appl. No. 11/606,340, Office Action mailed Feb. 5, 2009.

U.S. Office Action for U.S. Appl. No. 11/369,658 mailed Jul. 8, 2009.

U.S. Office Action for U.S. Appl. No. 11/608,056 mailed Aug. 20, 2009.

U.S. Office Action for U.S. Appl. No. 10/820,525 mailed Aug. 7, 2009.

U.S. Office Action for U.S. Appl. No. 11/693,661 mailed Aug. 28, 2009.

U.S. Supplemental Notice of Allowance and Fee Due mailed May 1, 2008, from U.S. Appl. No. 11/376,510.

U.S. Final Office Action for U.S. Appl. No. 10/807,680 mailed Jul. 10, 2008.

Wu et al., "Methods for Producing Low Stress Porous Low-K Dielectric Materials Using Precursors With Organic Functional Groups", U.S. Appl. No. 12/348,791, filed Jan. 5, 2009.

Wu et al., "Methods for Producing Low Stress Porous Low-K Dielectric Materials Using Precursors With Organic Functional Groups", U.S. Appl. No. 12/479,114, filed Jun. 5, 2009.

Van Den Hoek, et al., "VLSI Fabrication Processes for Introducing Pores Into Dielectric Materials," Novellus Systems, Inc., U.S. Appl. No. 12/606,920, filed Oct. 27, 2009.

U.S. Notice of Allowance and Fee Due mailed Nov. 24, 2009, from U.S. Appl. No. 10/987,208.

Allowed Claims from U.S. Appl. No. 10/987,208.

U.S. Appl. No. 11/606,340, Office Action mailed Feb. 5, 2009.

U.S. Notice of Allowance and Fee Due mailed Jul. 28, 2009, from U.S. Appl. No. 11/606,340.

Allowed Claims from U.S. Appl. No. 11/606,340.

U.S. Notice of Allowance and Fee Due mailed Feb. 3, 2010, from U.S. Appl. No. 11/936,754.

Allowed Claims from U.S. Appl. No. 11/936,754.

U.S. Office Action mailed Mar. 29, 2010 for U.S. Appl. No. 12/348,791.

U.S. Final Office Action for U.S. Appl. No. 11/369,658 mailed Mar. 18, 2010.

U.S. Office Action for U.S. Appl. No. 11/608,056 mailed Mar. 23, 2010.

U.S. Office Action for U.S. Appl. No. 11/693,661 mailed Feb. 24, 2010.

U.S. Notice of Allowance and Fee Due mailed Apr. 12, 2010, from U.S. Appl. No. 10/820,525.

Allowed Claims for U.S. Appl. No. 10/820,525.

U.S. Office Action for U.S. Appl. No. 12/606,920 mailed Jun. 11, 2010.

Notice of Allowance mailed May 25, 2010 for U.S. Appl. No. 12/348,791.

Allowed Claims for U.S. Appl. No. 12/348,791.

U.S. Final Office Action for U.S. Appl. No. 10/334,350 mailed Mar. 31, 2004.

U.S. Notice of Allowance for U.S. Appl. No. 10/334,350 mailed Sep. 22, 2004.

U.S. Office Action mailed Sep. 1, 2010 for U.S. Appl. No. 11/936,752.

* cited by examiner

METHODS FOR PRODUCING LOW STRESS POROUS AND CDO LOW-K DIELECTRIC MATERIALS USING PRECURSORS WITH ORGANIC FUNCTIONAL GROUPS

CROSS-REFERENCE TO RELATED APPLICATIONS

This application is a continuation claiming priority under 35 USC 120 from U.S. patent application Ser. No. 12/348,791, filed on Jan. 5, 2009, titled "METHODS FOR PRODUCING LOW STRESS POROUS LOW-K DIELECTRIC MATERIALS USING PRECURSORS WITH ORGANIC FUNCTIONAL GROUPS," by Wu et al. as inventors; which is a continuation claiming priority under 35 USC 120 from U.S. patent application Ser. No. 11/764,750, filed on Jun. 18, 2007, titled "METHODS FOR PRODUCING LOW STRESS POROUS LOW-K DIELECTRIC MATERIALS USING PRECURSORS WITH ORGANIC FUNCTIONAL GROUPS," by Wu et al. as inventors; which is a divisional claiming priority under 35 USC 120 from U.S. patent application Ser. No. 10/927,777, filed on Aug. 27, 2004, which is now U.S. Pat. No. 7,241,704, issued on Jul. 10, 2007, titled "METHODS FOR PRODUCING LOW STRESS POROUS LOW-K DIELECTRIC MATERIALS USING PRECURSORS WITH ORGANIC FUNCTIONAL GROUPS," by Wu et al. as inventors; which is a continuation-in-part claiming priority under 35 USC 120 from U.S. patent application Ser. No. 10/672,311, filed on Sep. 26, 2003, which is now U.S. Pat. No. 7,208,389, issued on Apr. 24, 2007, titled "METHOD OF POROGEN REMOVAL FROM POROUS LOW-K FILMS USING UV RADIATION," by Tipton et al. as inventors; which claims benefit under 35 USC 119 from U.S. Provisional No. 60/469,433, filed on May 9, 2003, titled "METHODS FOR PRODUCING LOW STRESS POROUS LOW-K DIELECTRIC MATERIALS USING PRECURSORS WITH ORGANIC FUNCTIONAL GROUPS," by Wu et al. as inventors; and which is a continuation-in-part claiming priority under 35 USC 120 from U.S. patent application Ser. No. 10/404,693, filed on Mar. 31, 2003, titled "METHOD FOR FORMING POROUS FILMS BY POROGEN REMOVAL COMBINED WITH IN SITU SURFACE MODIFICATION," by Humayun et al. as inventors; which applications are incorporated herein by reference in their entireties for all purposes. This application is also related to U.S. patent application Ser. No. 10/789,103, filed on Feb. 27, 2004, which is now U.S. Pat. No. 7,390,537, issued on Jun. 24, 2008, entitled "METHODS FOR PRODUCING LOW-K CDO FILMS WITH LOW RESIDUAL STRESS" by Wu et al. as inventors, which application is incorporated herein by reference in its entirety for all purposes.

FIELD OF THE INVENTION

The invention relates to methods for preparing dielectric films having low dielectric constants and high mechanical strength. In one aspect, the invention relates to methods for preparing a porous low-k film having low tensile stress and high mechanical strength. The methods involve the use of porogen technology. More specifically, the methods involve the deposition of a precursor film using one or more precursors with organic functional groups. Functional groups include moieties with carbon-carbon double or triple bonds and bulky organic groups. Once the precursor film is formed, the porogen is removed, leaving a low-k porous film. Methods of the invention provide a low stress, low-k porous film that can be used as a low-k dielectric layer in integrated circuits. Low dielectric constant carbon doped oxide (CDO) films and methods of their making are also provided.

BACKGROUND

There is a general need for materials with low dielectric constants (low-k) in the integrated circuit manufacturing industry. Using low-k materials as the inter-metal and/or inter-layer dielectric of conductive interconnects reduces the delay in signal propagation due to capacitive effects. The lower the dielectric constant of the dielectric, the lower the capacitance of the dielectric and the lower the RC delay of the IC.

Low k dielectrics are conventionally defined as those materials that have a dielectric constant lower than that of silicon dioxide, that is $k<\sim4$. Typical methods of obtaining low-k materials include doping silicon dioxide with various hydrocarbons or fluorine. These doping methods, however, generally cannot produce materials with dielectric constants lower than about 2.6. With more and more advanced technology needs, present efforts are focused on developing low-k dielectric materials with k less than 2.5. These ultra low-k dielectrics can be obtained by incorporating air voids within a low-k dielectric, creating a porous dielectric material. In technology nodes of 90 nanometers and beyond (e.g., 65 nanometers), carbon doped oxide dielectric materials look extremely promising. However, wide spread deployment of these materials in modern integrated circuit fabrication processes is hindered by increasing demands for high mechanical strength coupled with lower dielectric constants.

Methods of fabricating porous dielectrics typically involve forming a composite film (sometimes referred to herein as a "precursor film") containing two components: a porogen (typically an organic material such as a polymer) and a structure former or dielectric material (e.g., a silicon containing material). Once the composite film is formed on the substrate, the porogen component is removed, leaving a structurally intact porous dielectric matrix. Techniques for removing porogens from the composite film typically include, for example, a thermal process in which the substrate is heated to a temperature sufficient for the breakdown and vaporization of the organic porogen.

One issue with producing low-k porous materials relates to the fact that generally the more porous the material is (that is, the more air voids within the dielectric matrix), the lower the dielectric constant. In general, a lower dielectric constant is desirable. However, incorporating air voids may also diminish the film's mechanical strength and integrity, including increasing the film's intrinsic residual stress.

What are needed therefore are improved methods for forming porous and CDO dielectric low-k films with reduced tensile stress and improved mechanical integrity.

SUMMARY

The present invention addresses the aforementioned need by providing improved methods of preparing a low stress, low-k dielectric material on a substrate using precursors with various functional groups. In some preferred embodiments of the present invention, methods involve (a) forming a precursor film on the substrate, the precursor film comprising a porogen and a structure former, wherein the structure former has one or more carbon-carbon double or triple bonds, and (b) treating the precursor film to facilitate removing the porogen from the precursor film and thereby creating voids within the dielectric material to form the porous low-k dielectric material. In some preferred embodiments, methods involve (a)

forming a precursor film on the substrate, the precursor film comprising a porogen and a structure former, wherein the porogen has at least one bulky organic functional group, and (b) treating the precursor film to facilitate removing the porogen from the precursor film and thereby creating voids within the dielectric material to form the porous low-k dielectric material.

In most cases, the structure former will contain derivatives of silicon. The precursor film can be produced by co-depositing the structure former precursor with a porogen precursor or the structure former and porogen can both be obtained from the structure former precursor and no separate porogen precursor is deposited with the structure former precursor.

Examples of suitable structure former precursors that contain C≡C and/or C=C include trimethylsilylacetylene (TMSA), bis(trimethylsilyl)acetylene (BTMSA), triethynylcyclotrisiloxane derivatives, trivinylcyclotrisiloxane derivatives, vinylmethyldimethoxysilane (VMDMOS), methyldimethoxysilaneacetylene (MDMSA), methyldiethoxysilaneacetylene (MDESA), dimethylmethoxysilaneacetylene (DMMSA), dimethylethoxysilaneacetylene (DMESA), methylethoxysilane-di-acetylene (MESDA), divinylmethylethoxysilane (DVMEOS), 1,3,5-trivinyl-1,3,5-trimethylcyclotrisiloxane (VMTS) and 1,3,5-trivinyl-1,3,5-triisopropylcyclotrisiloxane (VPTS). The structure former precursor may also have a bulky organic group. Examples of these bulky organic structure former precursors include, for example, 5-(bicycloheptenyl)methyldimethoxysilane (BMDS), 5-(bicycloheptenyl)triethoxysilane (BTS) and 5-(bicycloheptenyl)diethoxysilaneacetylene (BDS).

The porogen precursor is preferably an organic material that can be easily removed by subsequent processes. One preferred class of porogen precursor is polyfunctional cyclic non-aromatic compounds. More preferably, the polyfunctional cyclic non-aromatic compounds also contains at least one carbon-carbon triple or double bond. Particular examples of preferred compounds are 5-ethylidene-2-norbornene (ENB), 8,8-dimethylfulvene (DMF) and beta-pinene (BP).

The precursor film can be formed using a CVD process (e.g., a plasma enhanced chemical vapor deposition (PECVD) technique), a spin-on process, or another condensed phase method. In preferred embodiments, PECVD techniques are used. For PECVD methods, preferred deposition temperatures typically range between about 25 and 400 degrees Celsius, more preferably between about 100 and 300 degrees Celsius. After the precursor film is formed, treatments such as thermal treatment, plasma treatment, ultraviolet radiation exposure, e-beam exposure, or a combination thereof are used to facilitate removal of the porogen.

In one aspect of the invention, a carbon doped oxide (CDO) film containing carbon-carbon double bonds or carbon-carbon triple bonds or both is applied to a substrate by contacting the substrate with one or more CDO precursors having a carbon-carbon double bond, a carbon-carbon triple bond, or both. Because of the choice of precursors, the resulting film will have good mechanical properties while possessing a dielectric constant of not greater than about 2.7. In some implementations of the invention, the CDO film serves as an interlayer dielectric in an integrated circuit.

In a specific embodiment, the invention provides a method of preparing a carbon doped silicon oxide (CDO) film on a substrate. The method may be characterized by the following sequence: (a) providing the substrate to a deposition chamber; and (b) contacting the substrate with one or more CDO precursors, at least one of which contains some degree of unsaturation (e.g., a carbon-carbon triple bond or a carbon-carbon double bond). The method is conduced under process conditions in which the CDO film contains carbon-carbon triple bonds and has a dielectric constant of at most about 2.7 (preferably not greater than about 2.6). In some embodiments of commercial importance, the substrate is a partially fabricated integrated circuit, and the CDO film is, for example, interlayer dielectric.

These and other features and advantages of the invention will be described in detail below with reference to the associated drawings.

BRIEF DESCRIPTION OF THE DRAWINGS

The following detailed description can be more fully understood when considered in conjunction with the drawings in which.

DETAILED DESCRIPTION OF SPECIFIC EMBODIMENTS

Introduction

Figure 1B:
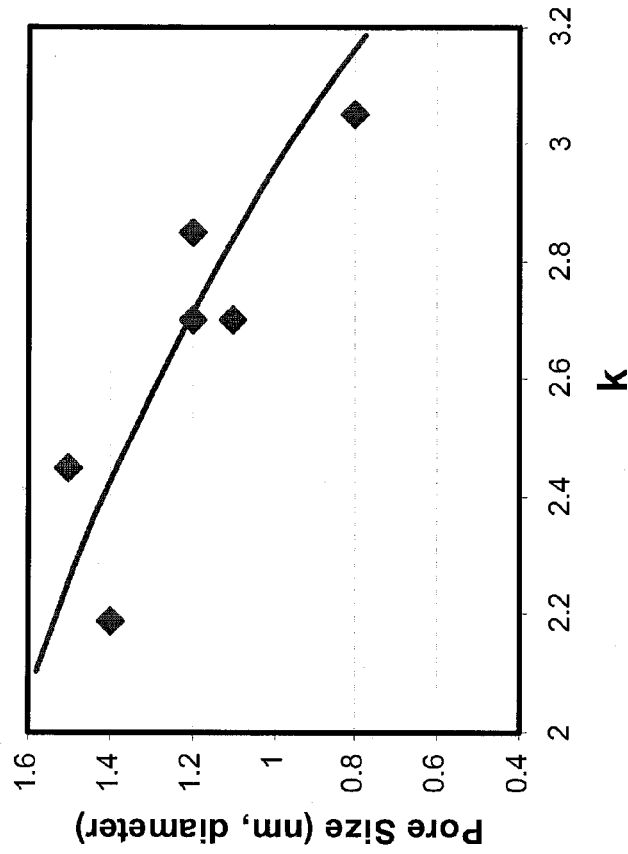
FIGS. 1A and 1B are graphs representing percent porosity and pore size as functions of dielectric constant (k) of porous films prepared using methods of the inventions.

In the following description, numerous specific details are set forth in order to provide a thorough understanding of the present invention, which pertains to formation of porous dielectric materials. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

The present invention involves forming a porous low-k dielectric material by way of a "precursor film" or "precursor layer" that contains a "structure former," typically a silicon and oxide containing dielectric material, which serves as a backbone of the porous network, and a porogen, which generates the porous regions within the porous network. Hence, the porogen and dielectric matrix typically exist as separate phases within the precursor layer. After the precursor film is formed, the porogen is removed from the precursor film to create a dielectric matrix or porous film. Thus, the locations within the precursor film where the porogen once resided become void locations in the final porous dielectric film.

In methods of the invention, there are two general approaches to forming the precursor film. Both of these approaches should be kept in mind as viable techniques that can be used in accordance with methods of the invention. In one approach, a structure former precursor and a porogen precursor is co-deposited on a substrate to create the precursor film. The structure former precursor and porogen precursor may be co-deposited in one process or in a multiple-phase process. Of course, more than one type of structure former precursor molecule and more than one type of porogen precursor molecule may be used in any suitable combination. In an alternative approach, the structure former precursor comprises both the structure former and porogen. That is, the structure former precursor contains moieties serving as structure formers covalently bonded to moieties, preferably large bulky organic constituents, serving as the porogen. Thus, in the latter approach, the structure former precursor can be deposited without a separate porogen precursor to form the precursor layer. Also in the latter approach, more than one type or structure former precursor may be used to form the precursor film.

The present invention involves producing low-k porous dielectric film with improved film mechanical integrity. One measure of mechanical integrity is residual stress. Residual stress is comprised of an extrinsic stress component and an intrinsic stress component. Extrinsic stress is produced from a source external to the film. In integrated circuits, extrinsic stress is typically caused by the mismatch in thermo-mechanical properties between a dielectric layer and the underlying substrate, especially a mismatch in their thermal expansion coefficients. Lowering deposition temperature will minimize the extrinsic stress in a film, as will a smaller mismatch in coefficients of thermal expansion between the film and the substrate. Intrinsic stress can be traced to the film-growth mechanism and the final lattice structure of the dielectric material. From a materials standpoint, the intrinsic stress in porous dielectric films is determined by the integrity of the dielectric backbone structure. The present invention primarily focuses on improving the intrinsic stress of the porous film while maintaining a low dielectric constant.

As indicated previously, the precursor layer comprises a structure former and porogen. In some preferred embodiments of the present invention, the structure former includes at least two carbon atoms that are double or triple bonded. In these cases, the carbon-carbon double and triple bonds are preferably directly adjacent to the silicon atom in the structure former precursor. Many different chemical compositions may be used as the structure former precursor. In most cases, the structure former precursor includes at least silicon and oxygen since in many cases the network backbone is silicon oxide based. The structure former precursor may also include other elements such as halides. For relatively thick precursor layers, it will sometimes be desirable to use structure formers that are not opaque to the UV radiation if UV radiation methods are used to subsequently remove the porogen.

Examples of preferred structure former precursors include various organic silanes and organic siloxanes. Some specific examples of suitable structure former precursor with carbon-carbon double bonds include trivinylcyclotrisiloxane derivatives, tetravinylcyclotetrasiloxane derivatives, vinylmethyldimethoxysilane (VMDMOS) and divinylmethylethoxysilane (DVMEOS). Some specific examples of suitable structure former precursor with carbon-carbon triple bonds include triethynylcyclotrisiloxane derivatives, trimethylsilylacetylene (TMSA), bis(trimethylsilyl)acetylene (BTMSA), methyldimethoxysilaneacetylene (MDMSA), methyldiethoxysilaneacetylene (MDESA), dimethylmethoxysilaneacetylene (DMMSA), dimethylethoxysilaneacetylene (DMESA), methylethoxysilane-di-acetylene (MESDA), 1,3,5-trivinyl-1,3,5-trimethylcyclotrisiloxane (VMTS) and 1,3,5-trivinyl-1,3,5-triisopropylcyclotrisiloxane (VPTS). In some cases, the structure former precursor additionally contains bulky organic functional groups. Once deposited, the bulky organic functional groups will be considered part of the porogen in the precursor film since they will also be removed to leave void regions in the resultant porous film. As such, these structure former precursors that contain bulky organic functional groups may be deposited with or without a porogen precursor. Examples of these types of structure former precursors include 5-(bicycloheptenyl) methyldimethoxysilane (BMDS), 5-(bicycloheptenyl)triethoxysilane (BTS) and 5-(bicycloheptenyl)diethoxysilaneacetylene (BDS).

Although not wishing to be bound by theory, it is believed that carbon-carbon double and triple bonds as part of the structure former precursor promotes cross-linking, i.e., polymerization, within the structure former, which has been found to strengthen the integrity of the dielectric backbone and reduce internal stress of the film. It is believed that the carbon-carbon double and/or triple bonds promote cross-linking by introducing additional bonds of different length, bonds of different angles. And, in fact, it has been found through this invention that intrinsic stress can be reduced by incorporating carbon-carbon double and/or triple bonds. Some more details as to how carbon-carbon double and triple bonds relate to the intrinsic stress and other mechanical properties of a non-porous dielectric materials can be found in the previously mentioned U.S. patent application Ser. No. 10/789,103, which is incorporated herein in its entirety.

Regarding the porogen, generally, a porogen is any removable material that defines void regions in a dielectric matrix. Frequently, though not necessarily, the porogen and corresponding porogen precursor are organic materials. One preferred class of porogen precursors is the polyfunctional cyclic non-aromatic compounds. In particular, the porogen precursor will preferably include functional groups such as —CH=CH$_2$, —CH=CH—, —C≡CH, —C≡C—, —C=O and/or —COC—. One class of suitable compounds is norbornenes, such as 5-ethylidene-2-norbornene (ENB). Another typical example is 1,2,3,4-tetramethyl-1,3-cyclopentadiene (TMCP) (C$_9$H$_{14}$). A listing of more porogen precursor compounds can be found in U.S. patent application Ser. No. 10/672,311, which the present application is a continuation-in-part and which is incorporated herein in its entirety.

In some preferred embodiments of the present invention, the porogen has at least one bulky organic functional group. The bulky organic group could originate from the structure former precursor, as mentioned previously, or it could originate from the porogen precursor, if a porogen precursor is used. In other cases, both the structure former precursor and the porogen precursor have bulky organic groups. The bulky organic group will leave correspondingly sized pores in the resulting dielectric film. As such, to a large degree, one can choose the size of pores and the amount of void regions within the final porous film by the type and size of organic groups incorporated in the precursor film. It is generally desirable that the voids, and therefore the organic portions, i.e., porogen, be evenly distributed throughout the porous material and, to a certain extent, to be sufficiently large so as to incorporate more air in the film and thereby lower the overall dielectric constant of the film. Of course, the adding voids that are too large or that are not evenly distributed will sacrifice the integrity of the film. As known in the art, numerous suitable compounds can be classified as having bulky organic constituents, including those compounds having large linear or cyclic groups. In preferred embodiments, the bulky organic groups are three-dimensional polyfunctional groups that are spherical in shape. Examples of some preferable compounds include norbornenes, such as 5-ethylidene-2-norbornene (ENB). Other specific examples include 8,8-dimethylfulvene (DMF) and beta-pinene (BP). Some affects of using various porogen precursors on pore size, porogen concentration and dielectric constant are described by FIGS. 1A, 1B, 2A, 3A, 4A and corresponding descriptions below.

In certain preferred embodiments, the structure former includes at least two carbon atoms that are double or triple bonded and one or both of the structure former and/or porogen has at least one bulky organic functional group. In these cases, the residual stress reduction provided by the carbon-carbon double and/or triple bonds in the structure former precursor is combined with the low-k properties provided by the large porous regions left by the bulky organic groups.

Regarding techniques for depositing the precursor film, any of numerous techniques may be used. Typical methods include spin-coating processes, print-on, dip coating, thermal process and chemical vapor deposition—particularly plasma enhanced chemical vapor deposition (PECVD). Depending on the application, the thickness of the precursor film may range between about 30 nanometers and about 5 micrometers. Details of suitable deposition techniques are described in the cross-referenced and related references cited above and which are incorporated herein in their entireties. In preferred embodiments of the present invention, PECVD methods are utilized. It is noted that the invention is not limited to any particular type of deposition method. If PECVD processes are used, the deposition temperatures typically range between about 25 and about 450 degrees Celsius and chamber pressures typically range between about 1 Torr to 10 Torr. Of course, numerous factors dictate optimal deposition temperatures, gas flow rates and other process parameters.

The thickness of the precursor film (and hence the resulting porous dielectric layer) depends upon the ultimate application. As an example, the thickness may range between about 50 to 1500 angstroms for a hard mask application. For an interlayer dielectric or packaging application, the thickness may range up to about 0.1 to 5 microns. In some cases, extra thickness is required to provide some amount of sacrificial dielectric to accommodate a subsequent planarization step. In some cases, the thickness of the precursor layer may be driven in part by the ability of the UV radiation to penetrate the film and remove the porogen. Therefore relatively thinner precursor layers may be required for some processes.

Any suitable method may be used to remove the porogen from the precursor film. Preferred methods generally involve treating precursor film in such a manner that the porogen is at least partially decomposed and the decomposition products are volatilized away from the deposited precursor film. Typical methods include, for example, thermal processes (both slow and rapid), UV mediated methods wherein the precursor film is exposed to UV light, and e-beam methods. Note, however, the invention is not limited to any particular type of porogen removal method. For example, liquid solvent techniques may also be used. Note that the precursor layer formation and porogen removal operations can be conducted in a single vessel or in two separate vessels. Also, it is possible for a precursor layer formation and porogen removal to occur in one chamber and then for the substrate to be moved to a different chamber where more of the porogen is removed. In general, however, for mechanical simplicity, it is preferred to perform as many operations as possible in a single chamber.

After porogen removal, the resultant porous dielectric film will preferably have a dielectric constant less than about 2.7, preferably less than 2.5, and the low tensile stress, as measured by a Tencor FLX 5400 Automated Thin Film Stress Measurement System, will preferably be less than about 50 MPa.

Note that after the porogen is removed, any number of post porogen removal treatments may be implemented on the porous film. For example, a silanol capping process to replace dangling hydroxyl groups with non-polar groups (e.g., alkyl groups) and help the film maintain a low overall dielectric constant may be used. Details of some example suitable silanol capping methods are described in U.S. patent application Ser. No. 10/672,311, which the present application is a continuation-in-part and which is incorporated herein in its entirety.

The present invention also relates to methods of creating low-k carbon doped oxide (CDO) layers with high mechanical strength and low residual stress. Generally, CDO film refers to a material whose compositional elements include Si, O, C and H. It may contain traces of other elements, including fluorine (F) or germanium (Ge). "Low-k", in the context of this invention means that the dielectric constant of the CDO layer is not greater than about 3.5 and preferably not greater than about 2.7. In particularly preferred embodiments, the CDO layer has a dielectric constant of at most about 2.6.

Examples of principal precursors for CDO dielectrics of this invention include silane (in combination with a carbon containing precursor), alkylsilanes (e.g., trimethylsilane and tetramethylsilane), alkoxysilanes (e.g., methyltriethoxysilane (MTEOS), methyltrimethoxysilane (MTMOS) diethoxymethylsilane (DEMS), methyldimethoxysilane (MDMOS), trimethylmethoxysilane (TMMOS) and dimethyldimethoxysilane (DMDMOS)), linear siloxanes (e.g., diethoxymethylsilane), cyclic siloxanes (e.g. alkylcyclotetrasiloxanes such as octamethylcyclotetrasiloxane (OMCTS) and tetramethylcyclotetrasiloxane (TMCTS)), and various compounds with silyl groups. Note that one example of a silane is di-tert-butylsilane. In each class of compounds, the precursor may be entirely saturated or it may include one or more carbon-carbon triple bonds or double bonds. If the precursor is entirely saturated, then the process gas will require a secondary precursor that contains carbon-carbon double bonds or carbon-carbon triple bonds.

Precursors having carbon-carbon triple bonds or double bonds may be found in various classes of compound including, for example, silanes having at least one hydrocarbon group with a carbon-carbon double bond and at least one alkyl group or at least one oxy-hydrocarbon group, silanes having at least one hydrocarbon group with a carbon-carbon triple bond and at least one alkyl group or at least one oxy-hydrocarbon group, bis(alkylsilyl)acetylenes, bis(alkylsilyl)ethylenes, and siloxanes having pendant hydrocarbon groups with a carbon-carbon triple bond or double bond. Several silicon-containing hydrocarbons (with or without oxygen) have been identified as potential precursors that may be used in a deposition process to form CDO films having low dielectric constants. These include the following:

Ethynyltrimethylsilane ($SiC_5H_{10}$): ETMS, also known as trimethylsilaneacetylene (TMSA), $(CH_3)_3Si-C\equiv C-H$
Propargyltrimethylsilane ($SiC_6H_{12}$): PTMS, $(CH_3)_3Si-CH_2-C\equiv C-H$
Propargyloxytrimethylsilane ($SiC_6H_{12}O$): POTMS, $(CH_3)_3Si-O-CH_2-C\equiv C-H$
Bis(trimethylsilyl)acetylene ($Si_2C_8H_{18}$): BTMSA, $(CH_3)_3Si-C\equiv C-Si(CH_3)_3$ Bis(trimethylsilyl)methylene (Si$_2$C$_7$H$_{20}$): BTMSM, (CH$_3$)$_3$Si—CH$_2$—Si(CH$_3$)$_3$ Bis(trimethylsilyl)ethylene (Si$_2$C$_8$H$_{22}$): BTMSE, (CH$_3$)$_3$Si—CH$_2$—CH$_2$—Si(CH$_3$)$_3$ 1,3-Diethynyltetramethyldisiloxane (Si$_2$C$_8$H$_{14}$O): DTDS, HC≡C—Si(CH$_3$)$_2$—O—Si(CH$_3$)$_2$—C≡C—H 1,3-Divinyltetramethyldisiloxane (Si$_2$C$_8$H$_{18}$O): DVDS, H$_2$C=CH—Si(CH$_3$)$_2$—O—Si(CH$_3$)$_2$—CH=CH$_2$ Vinyltrimethylsilane (SiC$_5$H$_{12}$): VTMS, (CH$_3$)$_3$Si—CH=CH$_2$ Vinylmethyldimethoxysilane (SiC$_5$H$_{12}$O$_2$): VMDMOS, (CH$_3$O)$_2$(CH$_3$)Si—CH=CH$_2$ Dimethylmethoxysilaneacetylene (SiC$_5$H$_{11}$O): DMMOSA, (CH$_3$O)(CH$_3$)$_2$Si—C≡CH Methyldimethoxysilaneacetylene (SiC$_5$H$_{11}$O$_2$): MDMOSA, (CH$_3$O)$_2$(CH$_3$)Si—C≡CH Dimethylethoxysilaneacetylene (SiC$_6$H$_{13}$O): DMEOSA, (C$_2$H$_5$O)(CH$_3$)$_2$Si—C≡CH Methyldiethoxysilaneacetylene (SiC$_7$H$_{15}$O$_2$): MDEOSA, (C$_2$H$_5$O)$_2$(CH$_3$)Si—C≡CH Ethyldiethoxysilaneacetylene (SiC$_8$H$_{17}$O$_2$): EDEOSA, (C$_2$H$_5$O)$_2$(C$_2$H$_5$)Si—C≡CH Dimethylsilane-diacetylene (SiC$_6$H$_8$): DMSDA, (CH$_3$)$_2$Si(C≡CH)$_2$ Divinyldimethylsilane (SiC$_6$H$_{12}$): DVDMS, (CH$_3$)$_2$Si(CH=CH$_2$)$_2$ Methylsilane-triacetylene (SiC$_7$H$_6$): MSTA, (CH$_3$)Si(C≡CH)$_3$ Tetraacetylene Silane (SiC$_8$H$_4$): TAS, Si(C≡CH)$_4$ The functional groups are C=C (double bonds) and C≡C (triple bonds) which may be pendant or embedded within other functionalities. Preferably, the desired functional group in the precursor(s) is the C≡C (triple bonds). During deposition, these special functional groups become integrated in the CDO film on the substrate. Rigid C=C and/or C≡C bonds, and their derivative bonding structures through crosslinking with Si, O, and C, when embedded in the CDO film, strengthen the material matrix and alter Si—O—Si backbone structure of CDO films, resulting in a more rigid lattice, thus lowering the tensile stress of the CDO film. As presented below, the incorporation of C=C and C≡C bond and their derivative forms within the Si—O—Si structure was observed by FTIR and other analytical methods. As mentioned, such films may be formed from a single carbon-containing precursor or multiple precursors in combination. Obviously, if a single precursor is used, then it must contain at least one carbon-carbon triple or double bond. But if multiple precursors are used in combination, it is not necessary for each of them to include an unsaturated group. Various primary precursors may be employed which have no double bonds or triple bonds.

Examples of secondary precursors include relatively small molecules having 2 to 6 carbon atoms and one or more carbon-carbon double bonds or carbon-carbon triple bonds. Specific examples include C$_3$H$_4$: CH$_3$—C≡C—H, C$_2$H$_2$: H—C≡C—H, C$_2$H$_4$: CH$_2$=CH$_2$, C$_3$H$_6$: CH$_2$CHCH$_3$, C$_3$H$_4$: CH$_2$=C=CH$_2$, Cyclopropene (H$_2$CCHCH), 1,3,5-Hexatriene (C$_6$H$_8$—CH$_2$=CH: CH=CH: CH=CH$_2$), and 2-Methyl-1-buten-3-yne (C$_5$H$_6$—CH$_2$=C(CH$_3$):C≡C—H). Other potential candidates for secondary precursors are silicon-containing hydrocarbons, or oxygen-containing hydrocarbons.

The precursor, in liquid or gaseous form, is but one component of the process chemicals employed during deposition. The process chemicals are those gases or liquids introduced into a reactor, such as a chemical vapor deposition (CVD) reactor, to allow deposition of the CDO film. Generally, the process gases will include at least a carrier gas and one or more precursor gases/liquids introduced to the reaction chamber via the carrier gas. At least one of the precursors or the carrier gas should act as a source of oxygen. The source of silicon usually comes from a precursor gas/liquid. The hydrocarbon groups for the CDO film (including groups containing carbon-carbon double bonds and triple bonds) may come from either the precursor chemical(s) or the carrier gas, as indicated.

Generally, the carrier gas is provided in much greater volumes than the precursor gases. It is used as a delivery vehicle and a means for sweeping precursor materials and byproducts through the reactor. Various oxygen containing gases such as molecular oxygen (O$_2$), ozone (O$_3$), hydrogen peroxide (H$_2$O$_2$), nitrous oxide (N$_2$O) and carbon dioxide (CO$_2$) may be used. Carbon dioxide is preferred for many applications of this invention. In some embodiments hydrogen is used as the carrier gas. In still other embodiments, inert gases such as helium, argon, etc. are used. Examples of hydrocarbon carrier gases include acetylene (C$_2$H$_2$), ethylene (C$_2$H$_4$), propene (CH$_2$=CHCH$_3$), propyne (CH$_3$C≡CH), 1,2-propadiene (CH$_2$=C=CH$_2$), and Cyclopropene (H$_2$CCHCH).

In one example, the process gas employs a carrier gas but no separate oxygen source (e.g., molecular oxygen, ozone, hydrogen peroxide or carbon dioxide). Examples of the carrier gas include inert gases and hydrogen. In this example, a single precursor provides all the necessary oxygen, silicon, and carbon, including the carbon-carbon triple bonds and/or double bonds. As indicated, siloxanes and various silanes or compounds having silyl groups with hydrocarbon oxy moieties are suitable for this purpose.

In a second process gas example, the carrier gas again provides no oxygen. In this case, however, there are at least two precursor gases. The primary precursor provides oxygen, silicon, and some amount of carbon and hydrogen. Examples of such primary precursors includes TMCTS, DEMS, MTEOS and OMCTS. A secondary precursor is employed to provide the carbon-carbon triple bonds and/or double bonds. Note that in some cases, the carrier gas could be one of the secondary precursor hydrocarbons.

In a third process gas example, the carrier gas supplies some or all of the oxygen. As indicated, examples of suitable oxygenated carrier gases are carbon dioxide, ozone, hydrogen peroxide, molecular oxygen or other oxygen containing molecules. In this third example, only a single precursor is employed. It may or may not include oxygen. In cases where no oxygen is used, it could simply be a hydrocarbon silane material. Preferably, however it includes some degree of unsaturation. More preferably, the unsaturation involves one carbon-carbon triple bond. Examples of suitable precursors for this embodiment include ETMS or TMSA, PTMS, BTMSA, TAS, MSTA, MDEOSA, DMEOSA, DMSDA and VTMS. Any one of these "single precursors" may be used in conjunction with a carrier gas.

In a fourth example of a process gas, oxygen is again supplied in a carrier gas such as carbon dioxide, oxygen, ozone, nitrous oxide, or hydrogen peroxide. However, in this case two or more precursors are employed. At least one of these may be similar to those identified in the second example. However, it is not necessary for oxygen to be present in either the primary or secondary precursors. However, in some embodiments, some amount of oxygen may be present in one or more of these molecules. Many relatively simple hydrocarbon silanes and/or silyl compounds may be employed as the primary precursor.

Various deposition techniques may be employed to form the CDO dielectric materials of this invention. These include various other forms of chemical vapor deposition (CVD) including plasma enhanced CVD (PECVD) and high-density plasma CVD (HDP CVD). HDP CVD of dielectric materials is described in various sources including U.S. patent application Ser. No. 09/996,619, filed Nov. 28, 2001 by Atiye Bayman et al. and titled "Gap Fill for High Aspect Ratio Structures", which is incorporated herein by reference for all purposes. Additionally, other techniques such as spin on techniques and deposition from supercritical solutions may be employed. But for many applications of this invention, a plasma based CVD process is employed.

Further the deposition conditions may be optimized to promote the crosslinking of incorporated bonds. Without this crosslinking, the film mechanical strength will generally be low due to the fact that an increase in content of methyl group $CH_3$ as a terminating group in the CDO film will reduce the bonding density per volume thus the bonding integrity of the film. With crosslinking, the Si—O—Si matrix structure is strengthened. As a result, the mechanical strength, or the fracture toughness, of the as deposited CDO film will be high.

Compositional bonds formed in CDO film of particular interest to this invention include Si—$CH_2$—Si, Si—C≡C—Si, Si—CH=CH—Si, Si—$CH_2$—$CH_2$—Si and other derivatives of these bonds due to Si, C or O crosslinking, such as Si—O—C≡C—Si, Si—O—CH=CH—Si, Si—C(—H, —OSi)—$CH_2$—Si, etc. It is noted that the chemical bond length and angle varies with the degree of saturation and crosslinking. Nominal bond length of the C—C bond is ~1.5 Å, that of the C=C bond is ~1.3 Å, that of the C≡C bond is ~1.2 Å, and that of the C—O bond is ~1.1 Å while the nominal bond length of the Si—O bond is ~1.6 Å and that of the Si—C bond is ~1.9 Å. It is evident that the incorporation of C≡C bond and its derivatives (C=C, C—C) and their crosslinking within the CDO film will greatly influence the Si—O—Si matrix structure. More specifically, the Si—O—Si bond angle will change significantly as the desired C related bonds are incorporated and crosslinked. Since the Si—O—Si matrix is the backbone structure of the CDO film, the change in Si—O—Si bond angle will increase the nanometer scale pore space in the matrix and thereby decrease the dielectric constant in the matrix.

As discussed above, residual stress can be reduced by incorporating C≡C bonds and its derivatives and promoting cross-linking/bridging in the CDO film. Due to the very reactive nature of carbon-carbon triple bond, there is abundant incorporation of C≡C bond in the as deposited CDO film. To further enhance its incorporation and its crosslinking within the CDO film, one method is to increase ion bombardment during the PECVD deposition. Process conditions that increase ion bombardment may be chosen to increase one or both of (a) the mean energy of ion striking the substrate and (b) the flux of ions reaching the substrate. Physically, these results may be achieved by selecting process conditions that accomplish one of the following: (i) increasing the mean free path of the ions in the plasma, (ii) reducing the distance that an ion must travel before striking the substrate, and (iii) increasing the mean energy or momentum of the ions that strike the substrate surface.

To increase the momentum or energy of ions striking the substrate surface, at least two different process conditions may be manipulated. First, using a dual-frequency reactor of the type described below, one can increase the relative amount of the low frequency component of the RF energy supplied to the reactor. This has the effect of increasing the length of time in a given oscillation during which ions are accelerated in a single direction (toward the wafer surface). Because the ions are exposed to a field in this direction for a longer period of time, they can accelerate to higher speeds and hence strike the substrate with greater momentum. Second, one can pulse the high frequency component of the RF power to accomplish a similar result.

As is well known in the art, in general, high frequency components of the RF power delivered to a reactor control the plasma density and low frequency components produce ion bombardment of the film. The high and low frequency components can be provided at any of a number of suitable frequencies. In a typical process, the LF component is provided in a frequency range of about 100 to 600 kHz, more preferably about 200-500 kHz, for example about 300 kHz. The High Frequency HF component is generally between 2-60 MHz—in one process example, an HF frequency of 13.156 MHz is used.

In one embodiment, the low frequency component of delivered RF power is between about 0 and 90 percent of the total power, and more preferably between about 0 and 60 percent of the total power (e.g., between about 5 and 40 percent). The optimal value will vary depending upon the mean free path of the ions and the various conditions that impact mean free path. In a specific example, the total power delivered is about 800 Watts on 6 200 mm wafers or 0.42 W/cm² in area density. This value can be varied depending upon the specific application and plasma reactor employed. In many cases, the low frequency component has a power area density of between about 0 W/cm² and 20 W/cm², and more preferably between 0 W/cm² and 1 W/cm².

In addition to varying the ratio of HFRF to LFRF, the HFRF power may be pulsed at a certain duty cycle, for example pulsing at between 500 Hz and 10 kHz and varying the HFRF duty cycle from 20-80%. This effectively superimposes a low frequency component on the plasma generation power.

Another method that may be used to increase ion bombardment during film deposition is to alter the deposition pressure. This simply increases the mean free path of ions in the deposition chamber. In one embodiment of the invention the deposition pressure is maintained at a pressure of between about 0.5 to 20 Torr, more preferably in the range of about 2-7 Torr.

Still another adjustment that may be used involves varying the gap between the two capacitor plates of the plasma reactor. In the apparatus described below, this involves choosing an appropriate gap between the showerhead (one capacitor plate) and a thermal block (a second capacitor plate) on which the wafer is positioned, thereby reducing the distance between the plasma source and the substrate. This reduces the distance that an ion must travel before striking the substrate. The ideal gap depends on the type of reactor employed and the process conditions. For many situations, the gap is preferably between about 3 and 20 millimeters.

Process optimization also includes setting the proper flow rates of the various compounds in the process gases. Note that the flow rates are chosen depending upon the amount of surface area to be covered. One can scale the flow rates chosen depending upon variations in the area to be deposited, including in situations where the reactor employs fewer or greater number of wafers and possibly employs 300 millimeter wafers as opposed to 200 millimeter wafers. For example, in experiments where six 200 millimeter wafers were used, the total precursor flow rate was 0.5 ml/min to about 10 ml/min. Note that this comprises the total flow rate of all precursors.

The deposition temperature can be tailored to meet the application. For some IC fabrication applications involving copper lines, for example, temperatures below 425 C may be required for intermetal dielectric deposition. In some embodiments, the substrate temperature is maintained between about 300 and 425 C (preferably between about 300 and 350 C) during CDO film deposition.

EXAMPLES

The following examples, Examples 1-6, are presented to help illustrate aspects of the invention. It should be understood that these examples are representative only, and that the invention is not limited by the detail set forth in these examples. Note also that the following examples are merely experimental and do not necessarily represent optimized conditions for preparing low-k, low stress porous films.

Example 1 illustrates eight porous films (Films A-F) prepared using different structure former precursors and porogen precursors (if used) using methods in accordance with the invention. Examples 2-6 illustrate the affects of using various process parameters such as precursor concentrations, flow rates, deposition temperatures and porogen removal techniques to prepare porous films.

Example 1

The following porous films (Films A-F) have been formed using methods in accordance with the invention. In some cases, the films were prepared using a structure former precursor without double or triple carbon-carbon bonds (e.g., DEMS, TMCTS) but with a porogen precursor with a bulky organic group (e.g., ENB, BP) (see Films A, D, E and F). As previously described, ENB and BP porogen precursors have polyfunctional groups, which can extend their structures in three dimensions and form spherically-shaped, bulky functional polymer. In one case, the film was prepared using a structure former precursor with double or triple carbon-carbon bonds (i.e., BTMSA) and no porogen precursor was used (see Film B below). And in one case, the film was prepared using a structure former precursor with double or triple carbon-carbon bonds (i.e., BTMSA) with a porogen precursor having a bulky organic group (i.e., ENB) (see Film C below). The following are descriptions of the precursor compositions and processes conditions for preparing Films A-F, with resulting k values and intrinsic stress/hardness values. In all examples, PECVD methods were used to deposit the precursor films and UV exposure methods were used to remove the porogen to form the porous films.

Figure 1A:
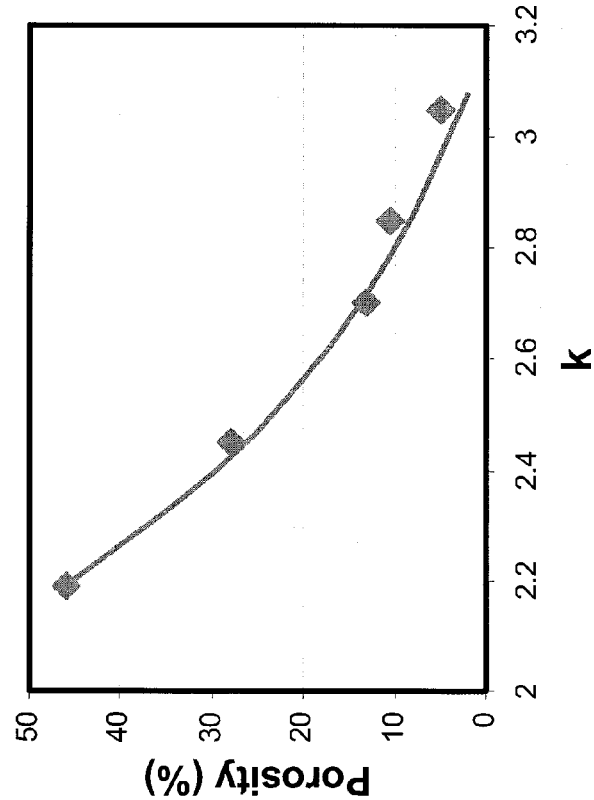

Films A1, A2 and A3: Three porous films, A1, A2 and A3, were prepared with the following precursors and process conditions using different amounts of porogen precursor and structure former precursor. Precursors: DEMS structure former precursor and ENB is a porogen precursor. Deposition conditions: high frequency RF power of 2500 Watts, ENB flow rate of 3 ccm, DEMS at a flow rate of 2 ccm, $CO_2$ flow rate of 6000 sccm, chamber pressure kept at 9.5 Torr, and deposition temperature of 250 degrees Celsius. Porogen removal conditions: UV exposure for 7 minutes. FIGS. 1A and 1B are graphs showing % porosity and pore size, respectively, as functions of the dielectric constant (k) of resulting porous films. As shown, the percent porosity in the film decreased with increasing k. This is an expected result since increasing the total amount of air voids within the film is expected to decrease the k of the film. In this example, the pore size decreases slightly with increasing k.

Film B: Precursors: BTMSA structure former precursor only. Deposition conditions: high frequency RF power of 2200 Watts, BTMSA flow rate of 1.5 ccm, $CO_2$ flow rate of 3000 sccm, chamber pressure kept at 7.5 Torr, and deposition temperature of 350 degrees Celsius. Porogen removal conditions: UV exposure for 2.5 minutes. The resulting porous film had a k value of 2.50.

Film C: Precursors: BTMSA structure former precursor and ENB porogen precursor. Deposition conditions: high frequency RF power of 1200 Watts and low frequency RF of 300 Watts, BTMSA flow rate of 2 ccm, ENB flow rate of 1 ccm, $CO_2$ flow rate of 3000 sccm, chamber pressure kept at 7 Torr, and deposition temperature of 285 degrees Celsius. Porogen removal conditions: Thermal treatment for 4 hours. The resulting porous film had a k value of 2.55 and intrinsic stress value of 46 MPa.

Film D: Precursors: DEMS structure former precursor and ENB porogen precursor. Deposition conditions: high frequency RF power of 2500 Watts, DEMS flow rate of 2 ccm, ENB flow rate of 2 ccm, $CO_2$ flow rate of 6000 sccm, chamber pressure kept at 9.5 Torr, and deposition temperature of 250 degrees Celsius. Porogen removal conditions: Thermal treatment for 4 hours, resulting k value of 2.37. Post-porogen removal treatment: UV exposure (1.75 W/cm$^2$) for 4 minutes. The resulting porous film had a k value of 2.39 and hardness value of 1.4 GPa.

Film E: Precursors: TMCTS structure former precursor and ENB porogen precursor. Deposition conditions: high frequency RF power of 1200 Watts, TMCTS flow rate of 1 ccm, ENB flow rate of 0.5 ccm, $CO_2$ flow rate of 5000 sccm, chamber pressure kept at 6 Torr, and substrate temperature of 70 degrees Celsius. Porogen removal conditions: Thermal treatment. The resulting porous film had a k value of 2.48.

Film F: Precursors: TMCTS structure former precursor and BP porogen precursor. Deposition conditions: high frequency RF power of 1000 Watts, TMCTS flow rate of 1 ccm, BP flow rate of 2 ccm, $CO_2$ flow rate of 7000 sccm, chamber pressure kept at 7.5 Torr. Porogen removal conditions: Thermal treatment. The resulting porous film had a k value of 2.5.

Example 2

Figure 2A:
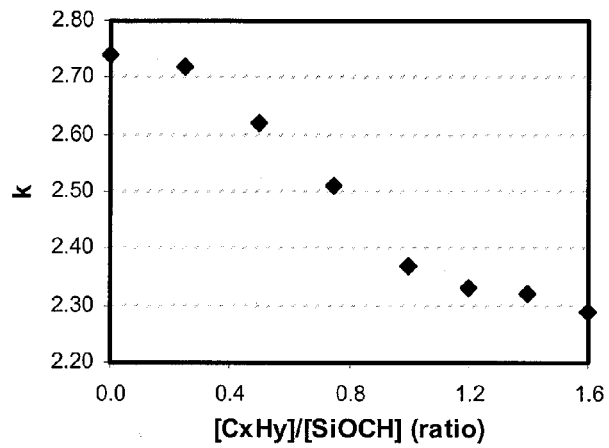
FIGS. 2A-2C are graphs representing the affects of using different precursor concentration on the dielectric constant, amount of porogen and residual film stress for porous films.
Figure 2B:
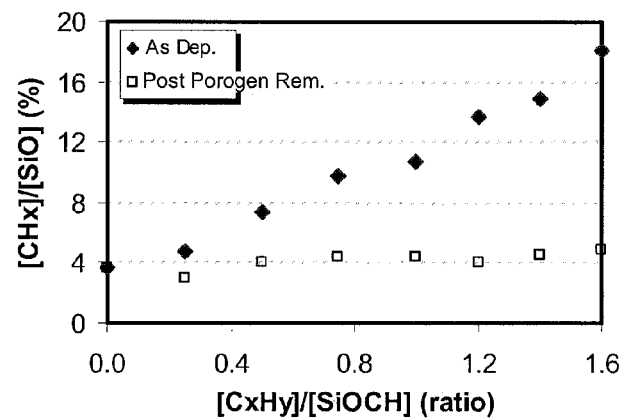
Figure 2C:
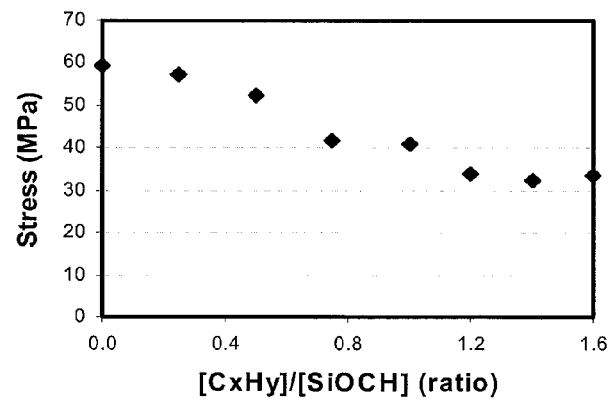

FIGS. 2A, 2B and 2C are graphs showing the affects of using different precursor concentrations of eight sample films. DEMS was used as the structure former precursor and ENB was used as the porogen precursor in each of the eight samples. The amount of ENB to DEMS ([ENB]/[DEMS]) ranged in value from 0 to about 1.6. All samples were treated with thermal treatments at 425 degrees Celsius for 4 hours to remove porogen. FIG. 2A shows that the k value of resulting porous films decreased with increasing amounts of ENB (CxHy) porogen precursor. Specifically, the k values decreased from about 2.75 to about 2.29 as [CxHy]/[SiOCH] increased from 0 to about 1.6. This decrease in k can be attributed to the increasing pore volume percentage since more porogen precursor was used. FIG. 2B shows the amount of $CH_x$ species relative to the amount of SiO species in the resulting porous films, as measured by FTIR. This graph shows that [$CH_x$]/[SiO] increased with increasing [CxHy]/[SiOCH] for the as-deposited (pre-porogen removal) film and that [$CH_x$]/[SiO] remained about the same (i.e., about 4%) with increasing [CxHy]/[SiOCH] after porogen removal. FIG. 2C shows that the intrinsic residual stress decreases with increasing [CxHy]/[SiOCH]. Specifically, the residual stress decreased from about 60 MPa to about 35 MPa as [CxHy]/[SiOCH] increased from 0 to about 1.6.

Example 3

Figure 3:
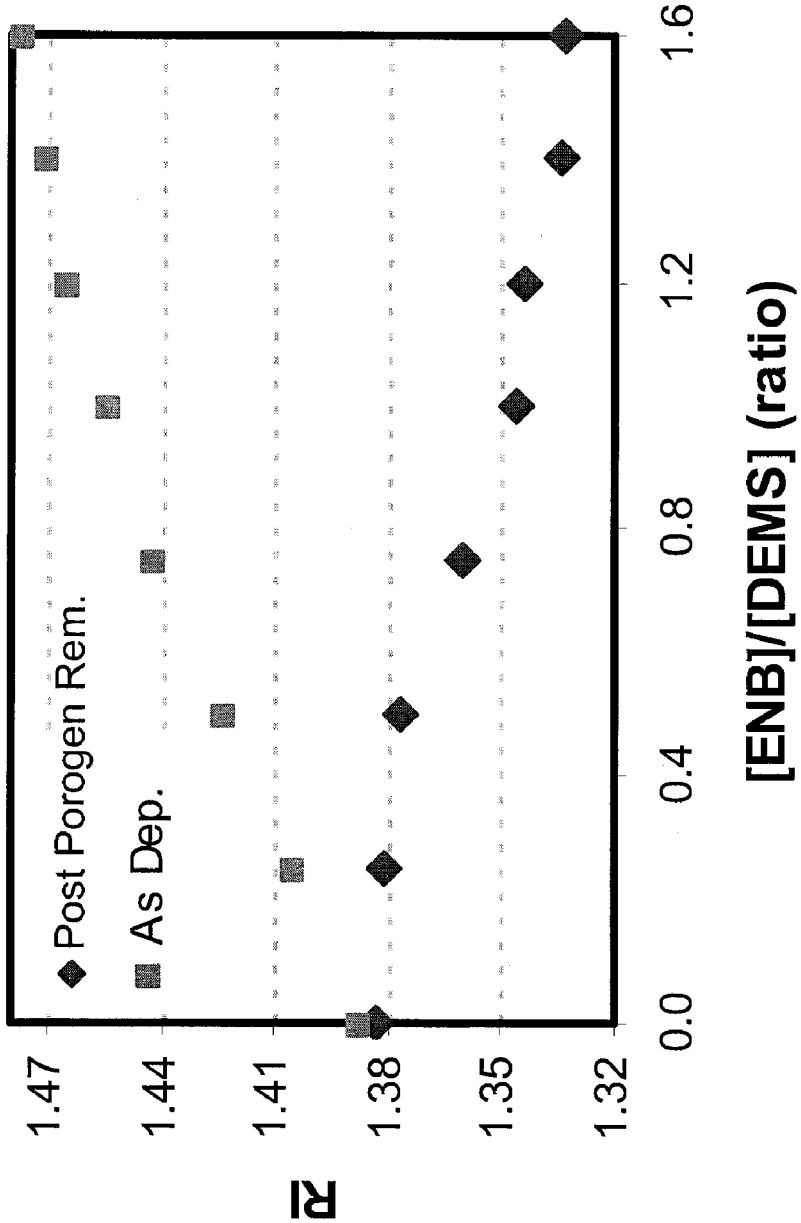
FIG. 3 is a graph representing is a graph representing the affects of using different concentrations of structure former precursors on the refractive indexes of porous films.

FIG. 3 is a graph representing the affects of structure former precursor concentration on the refractive index (RI) of eight sample films. These were the same eight sample films as those used in FIGS. 2A, 2B and 2C. RI is a measure of the opaqueness of the film with increasing RI indicating increasing opaqueness. Note that RI for air (i.e., voids within the film) is the least opaque and therefore will have very low RI. Porogen material is generally more opaque compared to structure former material. The data of FIG. 3 shows that RI for the as-deposited (pre-porogen removal) films increased with increasing [CxHy]/[SiOCH]. After porogen removal, RI decreased with increasing [CxHy]/[SiOCH], which also suggests that the pore volume percentage increases with increasing [CxHy]/[SiOCH].

Example 4

Figure 4A:
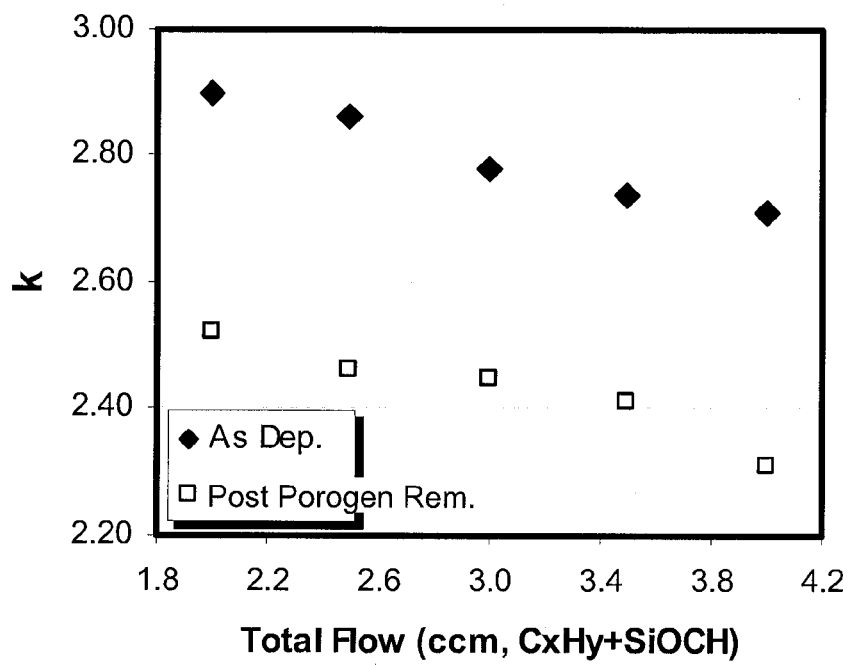
FIGS. 4A and 4B are graphs representing the affects of using different precursor flow rates on the dielectric constant and refractive index of porous films.
Figure 4B:
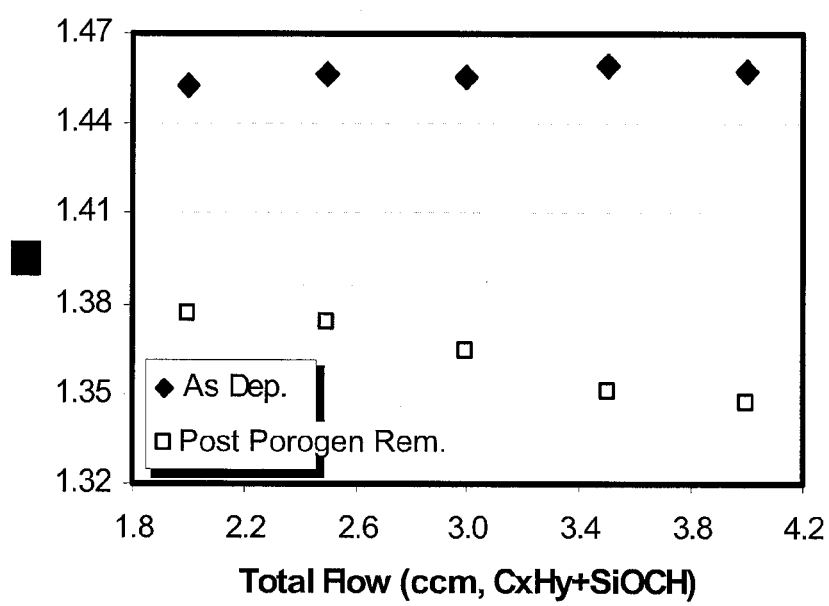

FIGS. 4A and 4B are graphs showing the affects of using different flow rates of the precursors during PECVD deposition process for five sample films. DEMS was used as the structure former precursor and ENB was used as the porogen precursor in each of the five samples. The total flow rate of ENB and DEMS (1:1 ratio) ranged from about 1.9 ccm to about 4.0 ccm. FIG. 4A shows that the k values for the films decreased within increasing total flow rate for the as-deposited (pre-porogen removal) films and for the post-porogen removal films. FIG. 4B shows that the RI remained about the same (around 1.45) as total flow rate increased for the as-deposited film and that the RI slightly decreased as total flow rate increased for the as-deposited film.

Example 5

Figure 5A:
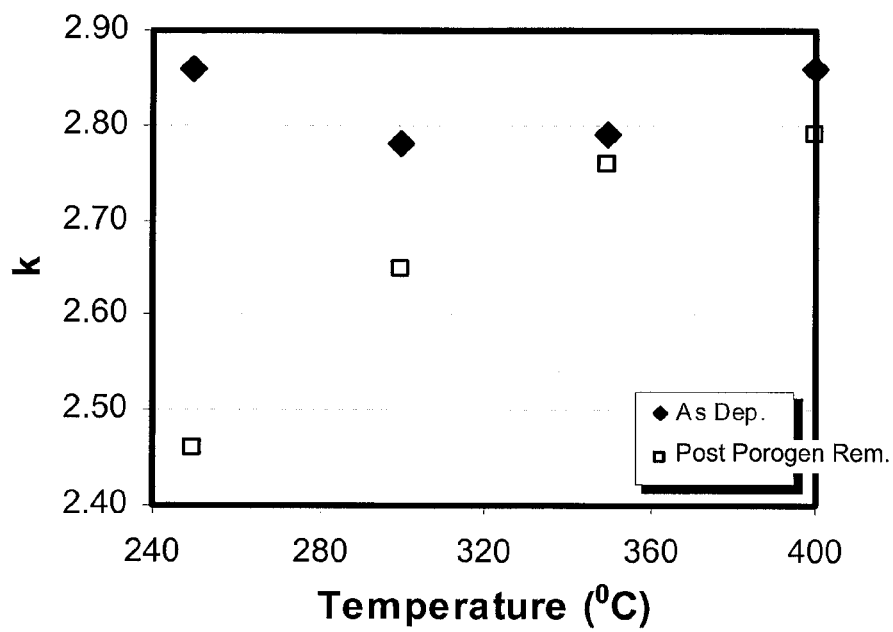
FIGS. 5A and 5B are graphs representing the affects of using different deposition temperatures on dielectric constant and refractive index of porous films.
Figure 5B:
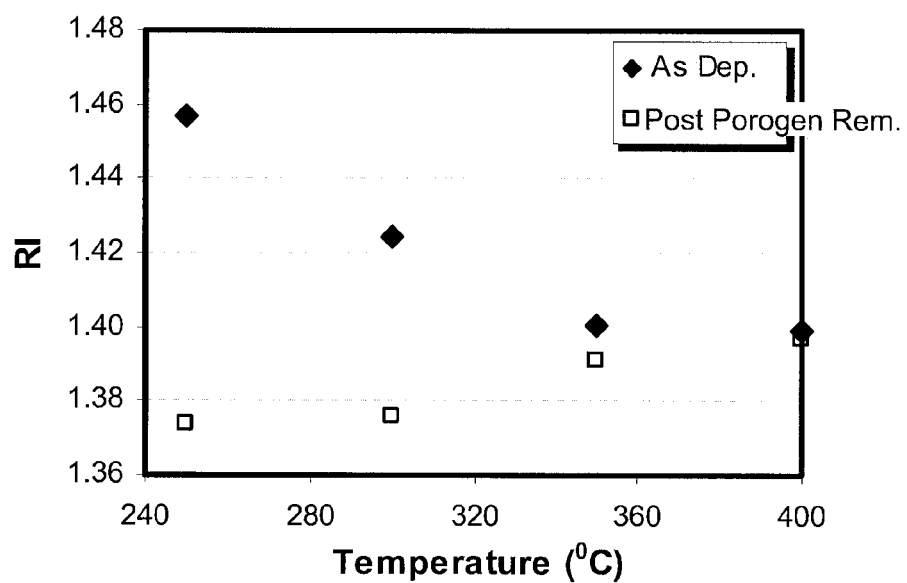

FIGS. 5A and 5B are graphs showing the affects of using different deposition temperatures during PECVD deposition process for four sample films. DEMS was used as the structure former precursor and ENB was used as the porogen precursor in each of the five samples. The deposition temperatures ranged from about 250 to about 400 degrees Celsius. FIG. 5A shows that the k values remained within about 2.78 and 2.87 for the as-deposited films and that the k values increased from about 2.46 to about 2.8 for the post-porogen removal films with increasing deposition temperatures. FIG. 5B shows that the RI remained decreased from about 1.46 to about 1.4 for the as-deposited film and that the RI may have slightly increased from about 1.37 to about 1.4 for the as-deposited film with increasing deposition temperatures.

Example 6

Figure 6:
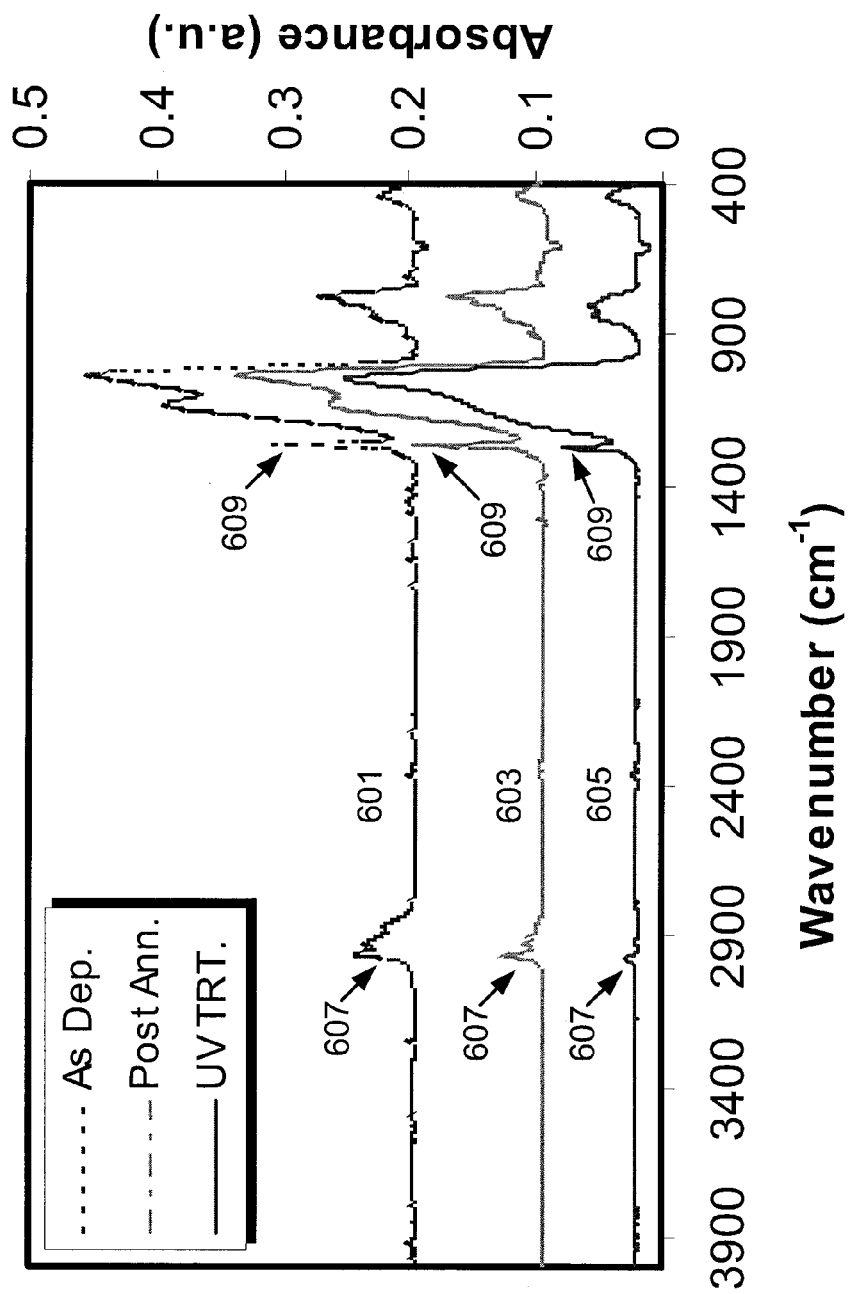
FIG. 6 is a composite graph of three FTIR spectra, one of a precursor film before porogen removal, another of a precursor film after porogen removal using a thermal process, and the third of a precursor film after porogen removal with UV radiation.

FIG. 6 is a composite graph of three FTIR spectra of film samples before porogen removal (spectrum 601), after a thermal treatment (indicated as "post ann.") for porogen removal (spectrum 603) and after a UV exposure treatment for porogen removal (spectrum 605). DEMS was used as the structure former precursor and ENB was used as the porogen precursor for all samples in the same ratios. The thermal treatment involved heating the wafer sample to about 425 degrees Celsius for about 4 hours. The UV treatment involved exposing the wafer sample to broadband UV light of 1.75 Watts/cm$^2$ for about 4 minutes. All three spectra exhibit absorption peaks (607) around 2840 to 3055 cm$^{-1}$ corresponding to the C—H stretch. Note that larger the C—H peaks indicate that more ENB porogen is incorporated into the film. As shown, both the thermally treated sample (spectrum 603) and the UV treated sample (spectrum 605) exhibit reductions in the C—H stretch peaks compared to the pre-treated film (spectrum 601). It is noted that the UV treated sample (spectrum 605) exhibits more of a decrease in the C—H stretch peaks, indicating more porogen removal. Also for all three spectra, the peaks (609) at 1273 cm$^{-1}$ are attributed to the presence of Si—CH$_3$ methyl groups, corresponding to the "T" groups ((SiO)$_3$Si—CH$_3$) from the DEMS structure former precursor. Reduction of this peak 609 indicates that more cross-linking has occurred. As shown, the amplitude of this Si—CH$_3$ peak was reduced significantly upon both UV light treatment and thermal treatment with more reduction with the UV light treatment. The spectra of FIG. 6 suggest that in comparing thermal treatment and UV light treatment, UV light treatment was more successful at removing porogen and promoting cross-linking.

Various additional examples will now be presented. These show recipes which yield k value<2.60 (for the first 4 examples) based on KLA-Tencor (San Jose, Calif.) F5 thickness measurement and a Hg probe. In all cases, deposition was conducted in a Sequel® PECVD Chamber.

Example 7

Figure 7:
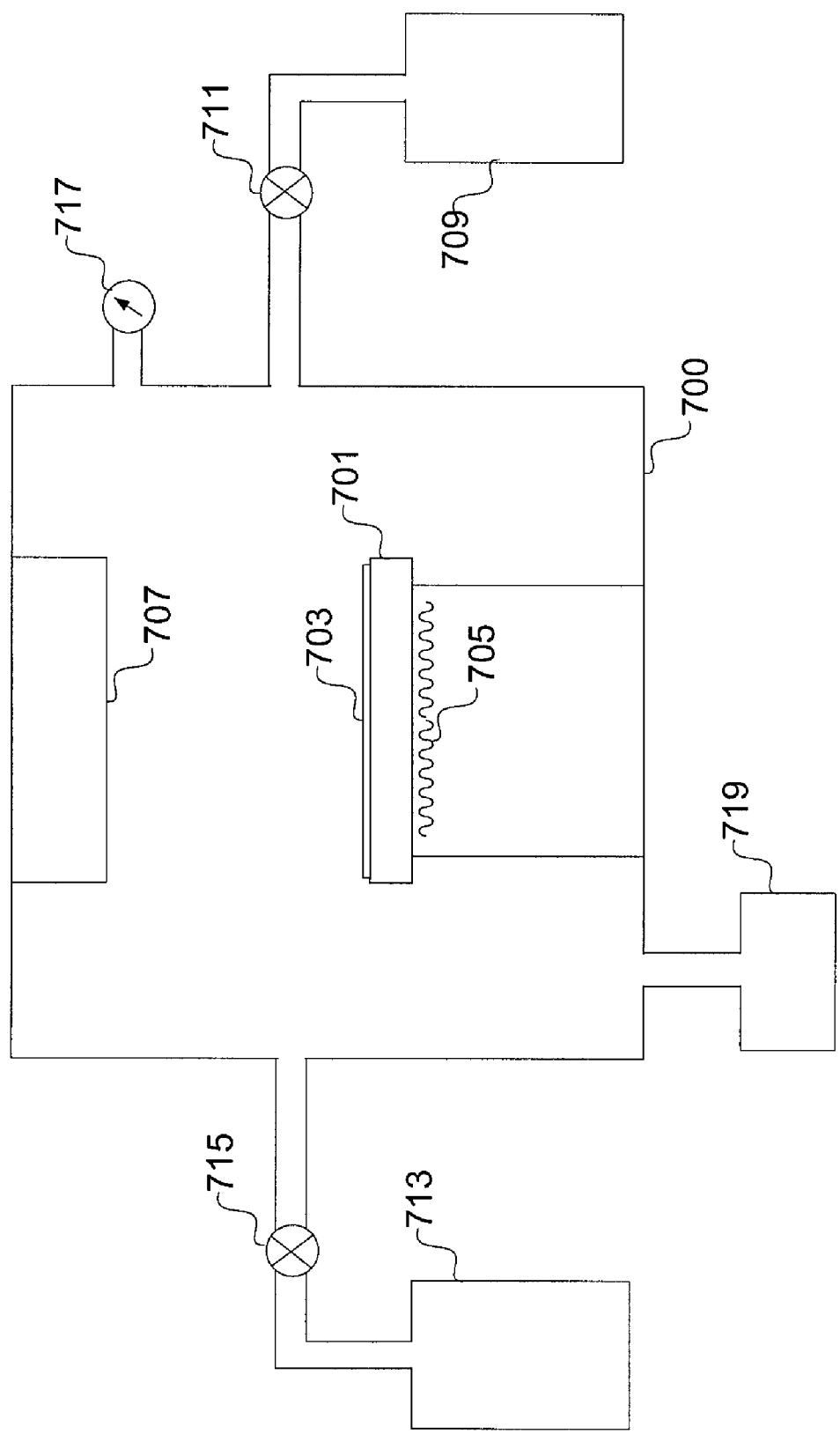
FIG. 7 is a schematic representation of apparatus suitable for porogen removal in accordance with certain embodiments of this invention.

Plasma was generated with a HFRF (high frequency) power of 750 W during CVD polymerization. LFRF (low frequency) power was set to 0 W. The gas mixture included TMCTS at flow rate of 1 ccm, ETMS at flow rate of 0.4 ccm and CO$_2$ at flow rate of 5500 sccm. The chamber pressure was kept at 7.5 Torr. The film had a dielectric constant of 2.60 for the as-deposited conditions. Process repeatability is illustrated in FIG. 7, indicating that dielectric constant can be reproducible at k=2.60+/−0.01.

Example 8

In this example, the plasma was operated at a HFRF power of 800 W, LFRF power at 0 W and a chamber pressure of 8.5 Torr was used. A gas mixture of TMCTS flow rate of 1 ccm, ETMS flow rate of 0.4 ccm and CO$_2$ flow rate of 4500 sccm was used during CVD polymerization. The as-deposited film had a dielectric constant of 2.58.

Example 9

In this example, the plasma was operated at an RF power of 800 W with a chamber pressure of 11.5 Torr. A gas mixture of TMCTS flow rate of 1 ccm, ETMS flow rate of 0.4 ccm and CO$_2$ flow rate of 5500 sccm was used during CVD polymerization. The as-deposited film had a dielectric constant of 2.54.

Example 10

In this example, a different secondary precursor was used for this process. The plasma was operated at a HFRF power of 850 W, LFRF of 0 W with a chamber pressure of 7.5 Torr. A gas mixture including TMCTS flow rate of 1 ccm, BTMSA flow rate of 0.4 ccm and CO$_2$ flow rate of 5500 sccm was used during CVD polymerization. The as-deposited film had a dielectric constant of 2.59.

Example 11

In this example, the HFRF power was set at 1200 W, and the LFRF at 300 W, in a Sequel chamber. A chamber pressure of 7 Torr was used in this process. The gas mixture of BTMSA flow rate of 2.0 ccm and CO$_2$ flow rate of 3000 sccm was used during PECVD deposition at 35° C. The as-deposited film had a dielectric constant of 2.69 and a low tensile stress of 24 MPa. The critical cracking thickness of this film was >5 μm.

Example 12

In this example, the HF RF power was set at 1000 W and no LF RF power was used in a Sequel® chamber. A chamber pressure of 7 Torr was used in this process. The gas mixture of ETMS flow rate of 1.5 ccm and $CO_2$ flow rate of 4000 sccm was used during PECVD deposition at 40° C. The as-deposited film had a dielectric constant of 2.61 and stress of 35.55 Mpa (tensile). The critical cracking thickness of this film is 3 μm.

Example 13

In this example, the HF RF power was set at 3000 W and LF RF power at 200 W in a Novellus Vector® chamber which can be used to deposit films on four 300 mm wafers simultaneously. A chamber pressure of 5.5 Torr was used in this process. The gas mixture of TMSA flow rate of 2.5 ccm, $CO_2$ flow rate of 4000 sccm and $O_2$ flow rate of 200 sccm was used during PECVD deposition at 40° C. The as-deposited film had a refractive index (RI) of 1.45, a dielectric constant of 2.71 and stress of 43 Mpa (tensile). The critical cracking thickness of this film is >5 μm.

Apparatus

The present invention can be implemented in many different types of apparatus. Generally, the apparatus will include one or more chambers (sometimes referred to as process vessels) that house one or more wafers and are suitable for wafer processing. In some cases, at least one chamber will include a UV source. A single chamber may be employed for all operations of the invention or separate chambers may be used. Each chamber may house one or more wafers for processing. The one or more chambers maintain the wafer in a defined position or positions (with or without motion within that position, e.g. rotation, vibration, or other agitation) during porogen removal and post porogen removal processes such as anneal and silanol capping, if used. For certain operations in which the wafer is to be heated, the apparatus may include a heating platen.

FIG. 7 is a schematic diagram of an example chamber system in accordance with the invention. This particular system is configured to use UV light for the porogen removal process. As stated earlier, the invention is not limited to any particular porogen removal methods or associated apparatus. A substrate holder 701 and a UV light source 707 are housed within a chamber 700. In alternate embodiments, the light source may be mounted outside the chamber on a window. Chamber 700 is capable of holding a vacuum and/or containing gases at pressures above atmospheric pressure. Chamber 700 may be one chamber in a multi-chambered system or it may be a stand-alone apparatus. Substrate holder 701 holds substrate 703 such that it can be irradiated with light from UV light source 707. Substrate holder 701 has a heater 705 that can heat the substrate to defined temperatures and can be controlled by a temperature controller (not shown).

UV light source 707 is a xenon lamp or other source of UV radiation of the required characteristics. As indicated above, the UV light source may be a lamp or a laser (not shown), such as an excimer laser, capable of providing intense UV light. In cases where a laser is used, various optical elements may be required to direct the UV light toward portions of the substrate. Methods for directing the laser light at different portions of the substrate at different times will be required as well. In a specific embodiment, the UV source directs UV radiation on the substrate at an intensity of between about 1 $μW/cm^2$ and 10 $W/cm^2$ in the range of 200 to 400 nanometers.

Inert gas source 709, such as a nitrogen gas source, can provide inert gas to chamber 700. The amount of inert gas introduced into chamber 700 is controlled by valve 711 and is measured by pressure gauge 717. During normal operation, chamber 700 is first evacuated using vacuum pump 719, and then the inert gas or other gas is introduced to a certain chamber pressure. Next, UV light source 707 is turned on and light is directed onto substrate 703. If an oxygen containing process is employed, oxygen gas source 713 can provide oxygen to chamber 700 controlled by valve 715. Processes involving mixtures of inert gas and oxygen may also be utilized. In cases where UV radiation occurs under vacuum, vacuum pump 719 can be used to pump down chamber 700 and UV irradiation can occur without the introduction of gas.

Note that the apparatus depicted in FIG. 7 is only an example of a suitable apparatus and other apparatuses designed for other methods involved in previous and/or subsequent processes may be used. For example, methods of the invention may be used with a standard PECVD chamber. Some supercritical fluid chamber systems may also be used. Many of these systems may also be used to perform the post-porogen removal anneal and/or silanol capping procedures, if used. Obviously, in these cases, the chamber system will likely be pumped out between each of the process steps.

While this invention has been described in terms of several embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention. The use of the singular in the claims does not mean "only one," but rather "one or more," unless otherwise stated in the claims.

What is claimed is:

1. A method of preparing a low-k dielectric on an integrated circuit substrate, the method comprising:
    forming a silicon oxide based dielectric film on the substrate, the film formed by contacting the substrate with ethynyltrimethylsilane and a carrier gas comprising $CO_2$ in a PECVD reactor processing chamber operated at a temperature of between about 300 and 425° C., a pressure of between about 2 and 7 Torr and a HF RF power of at least about 125 W.

2. The method of claim 1, further comprising exposing the film to a thermal, plasma, UV, e-beam or combination thereof post-formation treatment.

3. The method of claim 1, wherein the PECVD reactor processing chamber is operated at a temperature of about 400° C.

4. The method of claim 1, wherein the PECVD reactor processing chamber is operated at a HF RF power of about 250 W.

5. The method of claim 1 wherein the PECVD reactor processing chamber comprises a showerhead and a wafer support, and wherein a gap between the showerhead and wafer support is between about 3 and 20 millimeters.

6. A method of preparing a low-k dielectric on an integrated circuit substrate, the method comprising:
    forming a silicon oxide based dielectric film on the substrate, the film formed by contacting the substrate with vinyltrimethylsilane precursor and a carrier gas comprising $CO_2$ in a PECVD reactor processing chamber operated at a temperature of between about 300 and 425° C., a pressure of between about 2 and 7 Torr, a HF RF power of at least about 125 W.

7. The method of claim 6, further comprising exposing the film to a thermal, plasma, UV, e-beam or combination thereof post-formation treatment.

8. The method of claim 6, wherein the PECVD reactor processing chamber is operated at a temperature of about 400° C.

9. The method of claim 6, wherein the PECVD reactor processing chamber is operated at a HF RF power of about 125 W.

10. The method of claim 6 wherein the PECVD reactor processing chamber comprises a showerhead and a wafer support, and wherein a gap between the showerhead and wafer support is between about 3 and 20 millimeters.

11. A method of preparing a low-k dielectric on an integrated circuit substrate, the method comprising:
forming a silicon oxide based dielectric film on the substrate, the film formed by contacting the substrate with bis(trimethylsilyl)acetylene and a carrier gas comprising $CO_2$ in a PECVD reactor processing chamber operated at a temperature of between about 300 and 425° C., a pressure of between about 2 and 7 Torr and a HF RF power of at least about 125 W.

12. The method of claim 11, further comprising exposing the film to a thermal, plasma, UV, e-beam or combination thereof post-formation treatment.

13. The method of claim 11 wherein the PECVD reactor processing chamber comprises a showerhead and a wafer support, and wherein a gap between the showerhead and wafer support is between about 3 and 20 millimeters.

14. A method of preparing a low-k dielectric on an integrated circuit substrate, the method comprising:
forming a silicon oxide based dielectric film on the substrate, the film formed by contacting the substrate with a silicon-containing hydrocarbon precursor selected from the group consisting of vinyltrimethylsilane, ethynyltrimethylsilane, bis(trimethylsilyl)acetylene and combinations thereof, and an oxygenated carrier gas in a PECVD reactor processing chamber operated at a temperature of between about 300 and 425° C., a pressure of between about 0.5 and 20 Torr, and a HF RF power of between about 125 to 750 W at a frequency of between about 2 and 60 MHz.

15. The method of claim 14, wherein the precursor comprises vinyltrimethylsilane.

16. The method of claim 14, wherein the precursor comprisess ethynyltrimethylsilane.

17. The method of claim 14, wherein the precursor comprises bis(trimethylsilyl)acetylene.

18. The method of claim 14, wherein the oxygenated carrier gas is selected from the group consisting of $CO_2$, $O_3$, $H_2O_2$, $O_2$ and combinations thereof.

19. The method of claim 14, wherein the oxygenated carrier gas is $CO_2$.

20. The method of claim 14, wherein the PECVD reactor processing chamber is operated at a temperature of about 350 to 400° C.

21. The method of claim 14, wherein the PECVD reactor processing chamber is operated at a temperature of about 400° C.

22. The method of claim 14, further comprising exposing the film to a post-formation treatment selected from the group consisting of thermal, plasma, UV and e-beam treatments, and combinations thereof.

23. The method of claim 14, wherein the dielectric has a dielectric constant of less than about 2.7.

24. The method of claim 14 wherein the PECVD reactor processing chamber comprises a showerhead and a wafer support, and wherein a gap between the showerhead and wafer support is between about 3 and 20 millimeters.

* * * * *